United States Patent [19]

Cather

[11] Patent Number: 4,480,880

[45] Date of Patent: Nov. 6, 1984

[54] SLIDE AND SWING CHASSIS ASSEMBLY FOR ELECTRONIC EQUIPMENT

[75] Inventor: Robert L. Cather, Wilkins Township, Allegheny County, Pa.

[73] Assignee: Westinghouse Electric Corp., Pittsburgh, Pa.

[21] Appl. No.: 522,283

[22] Filed: Aug. 11, 1983

[51] Int. Cl.³ .......................................... F16C 29/04
[52] U.S. Cl. ................................... 308/6 R; 312/273
[58] Field of Search ................. 308/6 R, 3.8, 3.6, 3 R; 312/273, 323, 322

[56] References Cited

U.S. PATENT DOCUMENTS

| | | | |
|---|---|---|---|
| 2,337,159 | 12/1943 | Friedl | 45/96 |
| 2,717,188 | 9/1955 | Kuss | 312/323 |
| 2,856,450 | 10/1958 | Padgett et al. | 312/323 |
| 3,146,048 | 8/1964 | Graham et al. | 312/323 |
| 3,270,253 | 8/1966 | Binder et al. | 312/273 |
| 3,335,326 | 8/1967 | Bonin et al. | 312/273 |
| 3,662,225 | 5/1972 | Carter et al. | |
| 3,675,084 | 7/1972 | Jammaud | |
| 3,728,662 | 4/1973 | Puri | 339/17 LM |
| 4,002,955 | 1/1977 | Eggert et al. | 317/120 |
| 4,247,882 | 1/1981 | Prager et al. | 361/380 |
| 4,287,764 | 9/1981 | Staab et al. | 73/431 |
| 4,301,494 | 11/1981 | Jordan | 361/415 |

FOREIGN PATENT DOCUMENTS 2034528 6/1980 United Kingdom.

Primary Examiner—Lenard A. Footland
Attorney, Agent, or Firm—Daniel C. Abeles

[57] ABSTRACT

A slide and swing chassis assembly for electronic equipment which can be slid from an enclosure and swung to one side to permit complete access to equipment on the chassis, as well as equipment at the rear of the enclosure. The chassis assembly has a pair of chassis side frames which slide along slide members within the enclosure, one of the side frames having a pivotal slide plate attached to the rear portion which is pivotal from a closed position at the rear of the chassis to an extended position parallel with the side frame, such that the chassis may be slid from the enclosure along the slide members, and swung to one side while supported by the slide plate. A stop means is provided to move the slide plate from closed to extended position, and a restraining means is provided to prevent unintentional complete removal of the chassis and slide plate from the enclosure, with biasing means provided to also assist in moving the slide plate to closed position as well as in biasing the chassis to sideward position when swung on the pivoting means to the side of the enclosure.

14 Claims, 14 Drawing Figures

SLIDE AND SWING CHASSIS ASSEMBLY FOR ELECTRONIC EQUIPMENT

BACKGROUND OF THE INVENTION

In the design of enclosures for electronic equipment, a compact arrangement of the equipment is often required. In such enclosures, a movable chassis is often provided at the front of the enclosure while other equipment is situated at the rear of the enclosure. Such assemblies require means to permit access to all of the equipment within the enclosure for tasks such as routine maintenance, troubleshooting and repair, equipment retrofitting, and the like.

Several means have been proposed to provide access to the equipment which is tightly packed into a limited enclosure space. One means is to provide for complete removal of a portion of the equipment which provides access to the equipment removed as well as that which remains in the enclosure. This is a time consuming task, however, and can result in damage to the equipment removed if the removal is done carelessly. Another means is to provide for mounting of a portion of the equipment on hinges so that that portion can be swung about the hinge and moved, at least partially, from the enclosure. Such a construction puts severe limitations on the size of the equipment, since the equipment must be small enough such that, when it is swung in an arc about the hinge, the equipment will clear the end of the enclosure. Such a construction, however, still does not permit complete access to the interior of the enclosure since the equipment, even when moved about the hinge will still partially block the enclosure. A more common means for moving equipment within an enclosure is to mount the equipment on a chassis which is slidable from the interior of the enclosure. While such a sliding chassis system allows complete access to the equipment on the chassis that is moved from the enclosure, this system still blocks complete access to the interior of the enclosure and to other equipment at the rear of the enclosure.

It is an object of the present invention to provide a slidable and swingable assembly for a chassis in an enclosure that permits complete access to the equipment mounted on the chassis as well as other equipment that is located behind the chassis in the enclosure.

SUMMARY OF THE INVENTION

A slidable and swingable chassis system for use in an enclosure which permits complete access to the equipment on the chassis as well as to equipment at the rear of the enclosure includes a pair of slide members, such as slide brackets, one on each side of the chassis slide along which side frames of the chassis slide, and a slide plate pivotally attached, such as by a hinge, to one side frame of the chassis, at the rear thereof. The slide plate is pivotal, by means of a stop member on the slide bracket, from a closed position along the rear of the chassis to an open position parallel with the side of the chassis, and when the chassis is slidably moved clear of the enclosure, the chassis will be supported solely by the slide plate which is, in turn, supported by a slide member. The chassis is then swingable to one side, clear of the opening of the enclosure, such that complete access to the rear of the enclosure is provided. In a preferred embodiment, a biasing means, such as a spring, is provided attached to a side frame of the chassis and to the slide plate which assists in movement of the slide plate from extended to closed position, and also biases the chassis in a position that provides full access to the enclosure after the chassis has been swung to the side. A swing arm may be provided to assist in extension of the slide plate to parallel position with the side of the chassis, when the chassis is moved to the front of the enclosure, while a deflecting means may be provided at the rear of its enclosure to aid in moving the slide plate from the extended position to a position flush with the rear of the chassis when the chassis is moved to the rear of the enclosure.

DESCRIPTION OF THE PREFERRED EMBODIMENT

Figure 1:
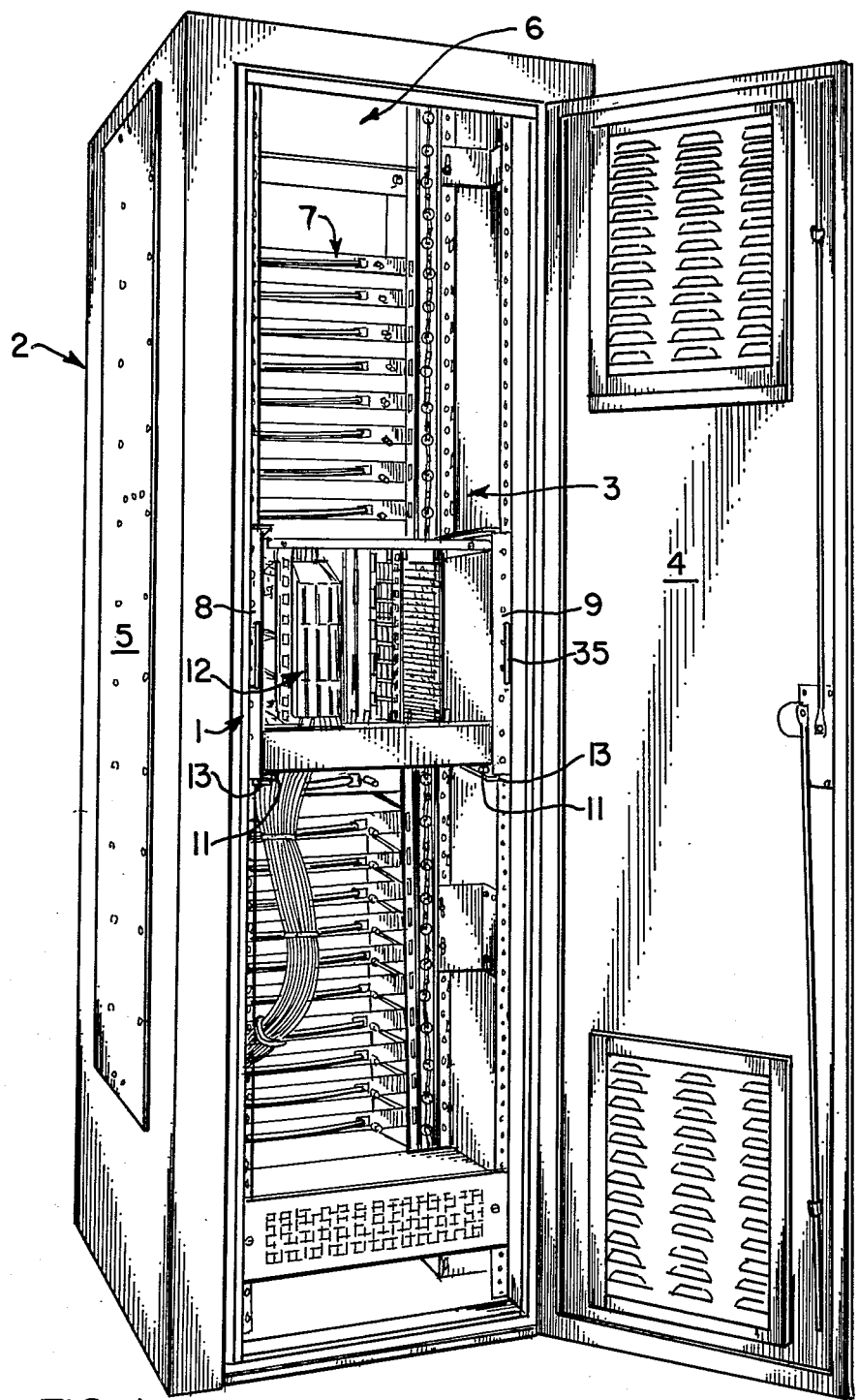
FIG. 1 is a perspective view from the front of an enclosure containing a slide and swing chassis of the present invention.
Figure 2:
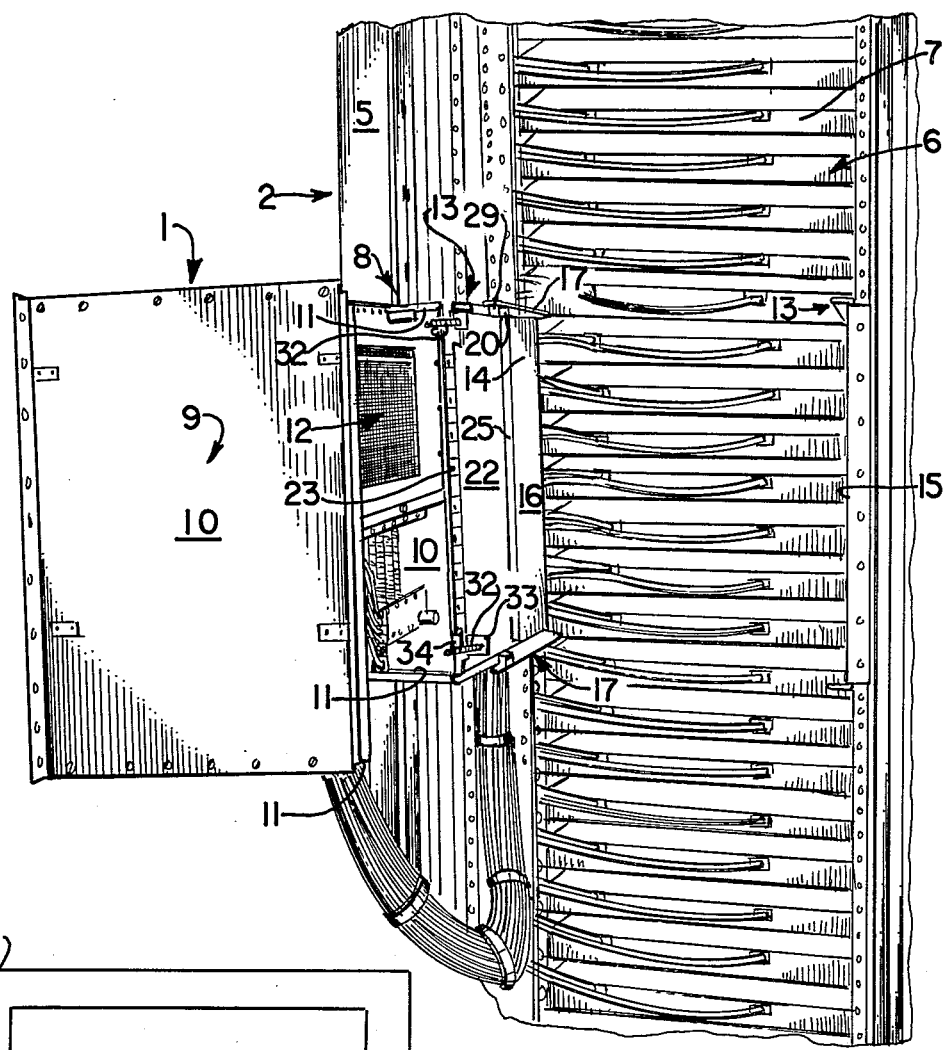
FIG. 2 is a view of the slide and swing chassis of FIG. 1 after the chassis has been slid from the enclosure and swung to one side to provide access to the rear of the enclosure.

The present invention provides a slidable and swingable chassis that can be slid from an enclosure and swung to one side to permit complete access to both the chassis equipment and to any equipment at the rear of the enclosure.

Referring now to the drawing, the chassis 1, is adapted for use in an enclosure 2, the enclosure having a front opening 3 that may have a door 4, sides 5, and a rear portion 6 which contains equipment 7 to which access may be desired.

The chassis has first and second side frames 8 and 9, which comprise a wall 10 with upper and lower inward flanges 11, the side frames being interconnected and containing therebetween further electrical equipment 12. The outer surface of the walls 10 are smooth and slidable along side members. Slide members 13, that are affixed to the inner surface of the sides 5 of the enclosure 2, comprise first and second outer slide brackets 14 and 15, these outer slide brackets 14 and 15 also each comprising a wall 16 with upper and lower inward flanges 17. The slide brackets 14 and 15 are secured to the respective sides 5 of the enclosure 2 by means of brackets 18. The outer slide brackets 14 and 15 may have strips 19 of nylon, or other low-friction material, which will provide a smooth sliding surface, on the walls and flanges.

There are attached to the flanges 17 of the outer slide brackets 14 and 15, stop members, such as a plurality of rollers 20, preferably two such rollers adjacent the front end 21 of each of the outer slide brackets 14 and 15. The rollers 20 are spaced from the wall 16 a distance that will permit sliding of the flanges 11 of the chassis side frames 8 and 9 between the rollers 20 and the respective wall of the outer slide brackets 14 and 15. Thus, the chassis 1 with its outer side frames 8 and 9 will slide between the outer slide brackets 14 and 15.

A slide plate is pivotally attached, by means of a hinge 23, to the first chassis side frame 8, at the rear thereof. The pivotal attachment by hinge 23 permits pivoting of the slide plate 22 from a closed position flush with the rear of the chassis 1 to an open or extended position parallel with the first chassis side frame 8. The hinge 23 is sufficiently strong so as to enable the hinge 23 and slide plate 22 to support the chassis 1 when the chassis 1 is slid from engagement with the outer slide brackets 14 and 15. The slide plate 22 may have at the end 24, spaced from the hinge 23, an inward lip 25. The slide plate 22 is of a dimension that will enable the same to also slide between wall 16 and the rollers 20 on the flange 17 of the outer slide bracket 14 when the slide plate is brought into a parallel planar position with the first chassis side frame 8 and slid from the rear to the front of the enclosure 2. Attached to the inner wall 26 of the slide plate 22, adjacent the lip 25 and the bottom of the slide plate, is a restraining means, such as an inwardly directed leg 27, which will contact the rollers 20 upon sliding of the slide plate 22 forward and prevent unintentional disengagement of the slide plate 22 from the first slide bracket 14. In instances where the entire chassis 1 and slide bracket 22 are to be removed from the enclosure, the leg 27 can be removed, by removal of attachment means 28, such as screws, and the slide plate 22 will slide past the rollers 20 and be removed from the enclosure.

When the chassis 1 is slid along the slide members 13, the slide plate 22 will contact rollers 20 on the first outer slide bracket 14, which, upon continued forward movement of the chassis 1, will cause the slide plate 22 to open to entended position in a parallel plane to the first chassis side frame 8. In order to assist in the pivoting of the slide bracket 22 about hinge 23, a swing arm 29 may be provided adjacent the top rollers 20 on the front outer slide bracket 14, which may comprise a further roller 30 attached to an arm 31 that is fixed to the slide bracket. The roller 30 is positioned by the arm 31 slightly to the rear of rollers 20 and spaced slightly further from the wall 16 of the first outer slide bracket. Thus, upon movement towards the front opening 3 of the enclosure 2, the slide plate 22 will first contact roller 30 which will initially deflect the slide plate into extended position, and the rollers 20 will then fully extend the slide plate 22 into a parallel planar position with the first chassis side frame 8.

In a preferred embodiment of the present chassis, biasing means, such as springs 32 are provided, preferably one at the top and one at the bottom of the chassis, interconnecting the first chassis side frame 8 and the slide plate 22, across the hinge 23. The springs 32 are connected at one end to an arm 33 on the slide plate 22 and to a pin or an indentation 34 on the first chassis side frame 8, such that the springs 32 will pass through a notch in the slide plate and be extendable across the axis of the hinge 23, when swinging of the chassis 1, or slide plate 22 about the hinge is effected.

The chassis preferably has handles 35 at the front thereof to enable ready sliding of the chassis 1 to the front and rear of the enclosure 3 along the slide members 13. There may also be provided, if desired, a deflecting means, such as a guide bar 36 which reaches across the rear of the enclosure to deflect the slide plate 22 towards the rear of the chassis 1 when the chassis is moved to the rear of the enclosure 3.

The operation of the slidable and swingable chassis is illustrated in FIGS. 6–12 which schematically show movement of the chassis from the rear to the front of the enclosure, swinging of the chassis to one side, swinging of the chassis back to a slidable relationship with the sliding members, and sliding of the chassis back to its rest position at the rear of the enclosure.

Figure 3:
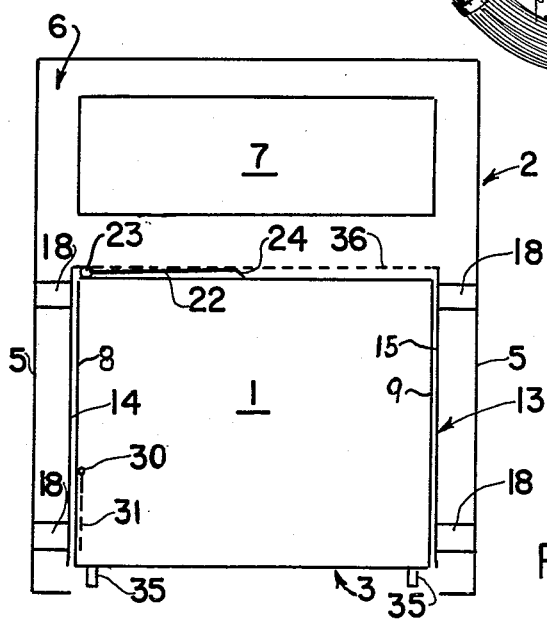
FIG. 3 is a schematic top view of the chassis in the enclosure showing the position of the slide plate flush with the rear of the chassis.
Figure 4:
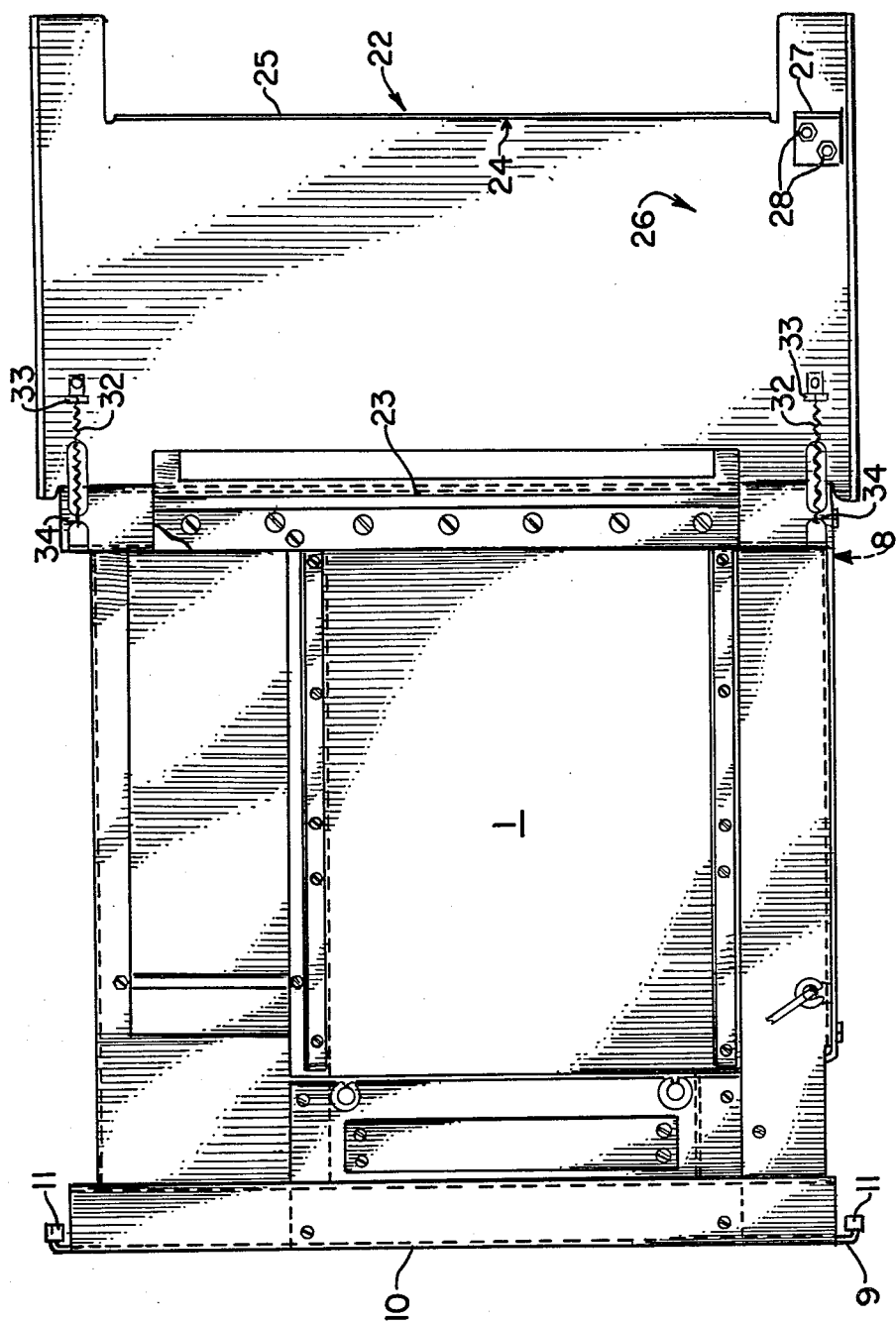
FIG. 4 is a side elevation of the slide plate showing the pivotally attached chassis swung to one side, exposing the rear of the chassis.
Figure 5:
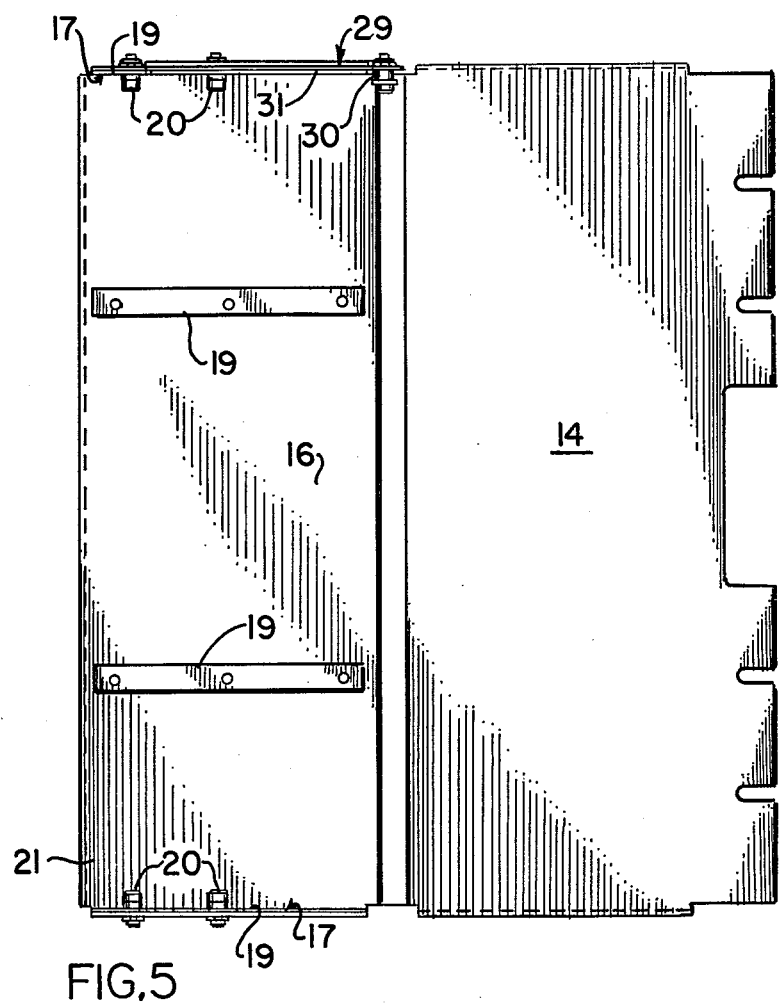
FIG. 5 is a side elevation of the first outer slide bracket illustrating the stop members and swing arm.
Figure 6:
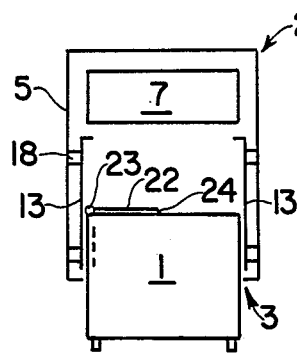
FIG. 6 is a schematic view of the chassis being slid to the front of the enclosure.
Figure 7:
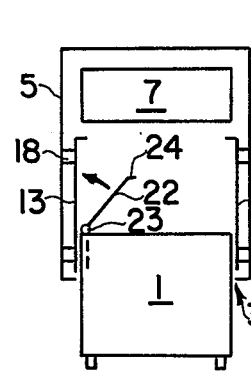
FIG. 7 is a schematic view of the slide plate being swung to extended position while the chassis is slid to the front of the enclosure.

From the rest position of the chassis, as illustrated in FIG. 3, the chassis is slid along slide members 13, towards the front 3 of the enclosure 2, as illustrated in FIG. 6, with the slide plate 22 flush with the rear of the chassis 1. When the slide plate 22 contacts the swing arm 29 and rollers 20, as illustrated in FIG. 7, the slide plate 22 will be pivoted about hinge 23 to a parallel relationship with the first chassis side frame 8.

Figure 8:
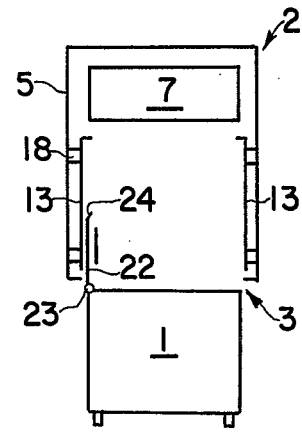
FIG. 8 is a schematic view of the chassis after sliding from the enclosure being supported exterior of the enclosure by the slide plate.
Figure 9:
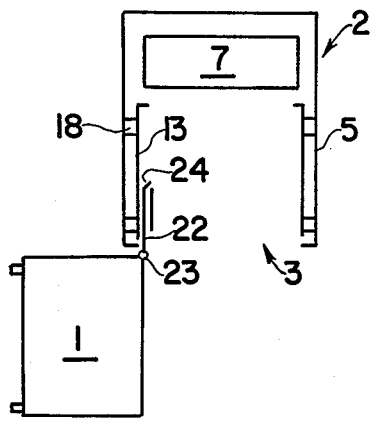
FIG. 9 is a schematic view of the chassis in full out position, swung aside to permit complete access to the chassis and to the rear of the enclosure.
Figure 9A:
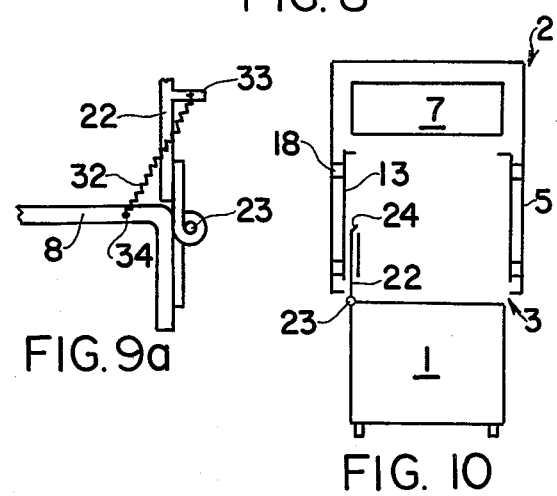
FIG. 9a is an enlarged fragmentation view showing the position of the biasing means in FIG. 9.
Figure 10:
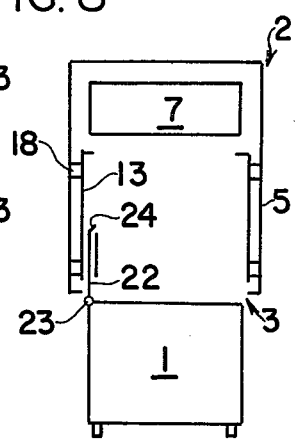
FIG. 10 is a schematic view of the chassis swung back to a position for re-insertion into the enclosure.
Figure 11:
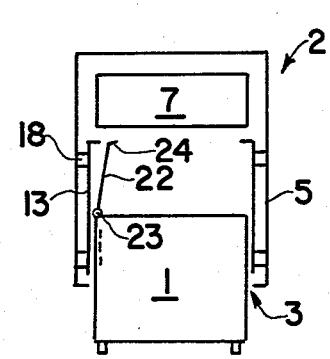
FIG. 11 is a schematic view of the chassis being slid back into the enclosure with the slide plate pivoting towards the rear of the chassis.
Figure 11A:
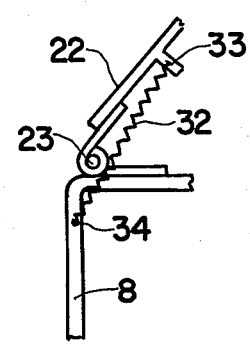
FIG. 11a is an enlarged fragmenting view showing the position of the biasing means in FIG. 11.
Figure 12:
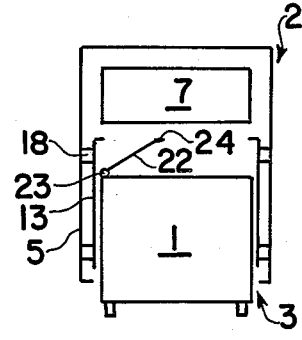
FIG. 12 is a schematic view of the chassis with the swing plate moving to a position flush with the rear of the chassis.

Continued sliding of the chassis 1, until it is free from the enclosure, as illustrated in FIG. 8, will result in the slide plate 22 being restrained by the stop members or rollers 20, while the chassis is free to pivot about hinge 23, while being supported solely by the slide plate 22. In the full out position, as shown in FIG. 9, the chassis 1, while supported by the hinge 23 and slide plate 22, is swung, to its left as shown in the drawing, until it is completely clear of the opening 3 of the enclosure 2. As illustrated in FIG. 9a, the spring 32 will cross over the axis of the hinge 23 and will bias the chassis 1 into its open position, away from the opening 3. When in the full open position, the chassis 1 is accessible from all sides, while the equipment 7, at the rear 6 of the enclosure is also fully accessible. In returning chassis 1 to its position within the enclosure 2, the chassis is swung back to a position in front of the enclosure 2 as shown in FIG. 10, and the chassis slid towards the rear portion 6 of the enclosure 2 along the sliding members 13. As the chassis slid towards the rear of the enclosure, as shown in FIG. 11, the spring 32, when the slide plate is clear of the stop members or rollers 20, will pull the slide plate 22 (FIG. 11a) back to a position flush with the rear of the chassis. As continued movement of the chassis to the rear of the enclosure 2 is effected, as shown in FIG. 12, the slide plate 22 will be pulled flush with the rear of the chassis 1, until the chassis is once again in its rest position. In some instances, a guide bar, such as 36, may be used to capture the slide plate and hold the same against movement by shock or vibrations.

What is claimed is:

1. A movable chassis system for use in an enclosure having a front opening, sides, and a rear portion to which access is desired, comprising:
   slide members along the sides of the enclosure;
   a chassis supported by said slide members and slidable therealong;
   a slide plate pivotally attached at one side of the rear of the chassis, movable from a closed position along the rear of the chassis to an extended position parallel with said one side, slidable along the slide member when in extended position, and adapted to support the chassis; and
   stop means adapted to move said slide plate to extended position when the chassis is moved towards the opening of the enclosure, such that the chassis is slidable from the rear of the enclosure to the opening and pivotal to one side, while supported by the slide plate, to freely expose the rear portion of the enclosure.

2. A movable chassis system as defined in claim 1 wherein said slide members comprise first and second slide brackets, each having a wall and upper and lower inner flanges, on which said chassis is supported.

3. A movable chassis system as defined in claim 2 wherein said stop means comprise rollers attached to the flanges of a slide bracket.

4. A movable chassis system as defined in claim 2 wherein the chassis has first and second side frames attached thereto comprising a wall and upper and lower inward flanges complementary with the flanges of the slide members.

5. A movable chassis system as defined in claim 4 wherein the slide plate is pivotally attached to said first side frame of said chassis by a hinge and the stop means comprises rollers on the flanges of the first and second slide brackets, the hinge being passable through the rollers on the first slide bracket.

6. A movable chassis system as defined in claim 5 wherein a restraining means is provided on the slide bracket which abuts the stop means to prevent disengagement of the slide plate from the first slide bracket.

7. A movable chassis system as defined in claim 6 wherein said restraining means comprises an inwardly directed leg attached to the slide plate.

8. A movable chassis system as defined in claim 7 wherein said leg is removably secured to the slide plate.

9. A movable chassis system as defined in claim 5, including a swing arm on the first slide bracket adapted to extend the slide plate upon contact of the slide plate therewith by sliding of the chassis towards the front opening of the enclosure.

10. A movable chassis system as defined in claim 5 including biasing means attached to the first side frame and to the slide plate to bias the slide plate in a position along the rear of the chassis.

11. A movable chassis system as defined in claim 10 wherein said biasing means biases the chassis in a position to the side of the opening of the enclosure when the chassis is pivoted to said side.

12. A movable chassis system as defined in claim 11 wherein said biasing means comprises at least one spring, one end of which is attached to the slide plate and the other end to said first side frame, adjacent the hinge.

13. A movable chassis system as defined in claim 1 wherein a deflecting means is attached to the enclosure adjacent the rear portion therof to deflect the slide plate from extended position to a position along the rear of the chassis when the chassis is moved towards the rear of the enclosure.

14. A movable chassis system for use in an enclosure having a front opening, and a rear portion to which access is desired comprising:
   first and second slide brackets, each having a wall and upper and lower inner flanges, one attached to each side of the enclosure;
   a chassis having first and second side frames attached thereto, comprising a wall and upper and lower inner flanges complementary with the flanges of said slide brackets, and slidable along said slide brackets;
   a slide plate pivotally attached to said first side frame of the chassis at the rear thereof, movable from a closed position along the rear of the chassis to an extended position parallel with said first side frame, slidable along the first slide bracket when in extended position, and adapted to support the chassis; and
   stop means, attached to said first slide bracket, adapted to move said slide plate to extended position when the chassis moved towards the opening of the enclosure, such that the chassis is slidable from the rear of the enclosure to the opening and pivotal to one side, while supported by the slide plate, to freely expose the rear portion of the enclosure.

* * * * *